(12) United States Patent
Morishita (10) Patent No.: US 12,464,826 B2
(45) Date of Patent: Nov. 4, 2025

(54) SEMICONDUCTOR DEVICE (71) Applicant: RENESAS ELECTRONICS CORPORATION, Tokyo (JP)

(72) Inventor: Yasuyuki Morishita, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 446 days.

(21) Appl. No.: 17/964,267

(22) Filed: Oct. 12, 2022

(65) Prior Publication Data

US 2023/0139094 A1  May 4, 2023

(30) Foreign Application Priority Data

Oct. 29, 2021 (JP) ................................. 2021-178382
Aug. 8, 2022 (JP) ................................. 2022-126689

(51) Int. Cl.
*H01L 27/02* (2006.01)
*H10D 89/10* (2025.01)
*H10D 89/60* (2025.01)

(52) U.S. Cl.
CPC .......... *H10D 89/611* (2025.01); *H10D 89/10* (2025.01); *H10D 89/601* (2025.01); *H10D 89/921* (2025.01); *H10D 89/931* (2025.01)

(58) Field of Classification Search
CPC .. H10D 89/611; H10D 89/601; H10D 89/921; H10D 89/931; H10D 89/10
See application file for complete search history.

(56) References Cited

U.S. PATENT DOCUMENTS

| 10,790,277 | B2 | 9/2020 | Maeda et al. |
| 2006/0236175 | A1 | 10/2006 | Usami et al. |
| 2010/0155845 | A1* | 6/2010 | Toba ............... H10D 89/10 257/355 |
| 2016/0086935 | A1 | 3/2016 | Fukuda |
| 2019/0164952 | A1 | 5/2019 | Chang et al. |

FOREIGN PATENT DOCUMENTS

| JP | 2000-236065 A | 8/2000 |
| JP | 2020-161721 A | 10/2020 |
| WO | 2016/203648 A1 | 12/2016 |

OTHER PUBLICATIONS

Office Action received in Corresponding German Patent Application No. 10 2022 211 502.3, mailed Apr. 17, 2023.
Office Action dated May 7, 2025, issued in corresponding JP Application No. 2022-126689, 7 pages.

* cited by examiner

*Primary Examiner* — Ermias T Woldegeorgis
(74) *Attorney, Agent, or Firm* — Rimon P.C.

(57) ABSTRACT

A semiconductor device includes an input/output cell, an IO power supply cell, a core power supply cell, and a core logic circuit arranged on a chip, and the core power supply cell includes an ESD protection circuit. The input/output cell includes a level shifter circuit and the level shifter circuit is arranged in the input/output cell. The core logic circuit is arranged outside the input/output cell. The core power supply cell is not arranged in the same row as the input/output cell, but is arranged in a third region provided between a first region in which the input/output cell and the IO power supply cell are arranged and a second region in which the core logic circuit is arranged.

2 Claims, 5 Drawing Sheets

SEMICONDUCTOR DEVICE

CROSS-REFERENCE TO RELATED APPLICATIONS

The disclosure of Japanese Patent Application No. 2021-178382 filed on Oct. 29, 2021 and Japanese Patent Application No. 2022-126689 filed on Aug. 8, 2022, including the specification, drawings and abstract is incorporated herein by reference in its entirety.

BACKGROUND

This disclosure relates to a semiconductor device, and provides a technology effectively applied to a semiconductor device having an ESD (Electro-Static-Discharge) protection circuit.

As described in Japanese Unexamined Patent Application Publication No. 2020-161721 (Patent Document 1), a semiconductor device in which a signal input to an input/output pad electrode from outside of the semiconductor device is sequentially transferred to an internal circuit via an input/output cell including an ESD protection element (referred to also as ESD protection circuit) and an input logic circuit and a level shift circuit has been known. Also, as described in International Patent Publication No. 2016/203648 (Patent Document 2), a semiconductor device in which an input/output cell and a power supply cell are arranged in an 10 region provided along the outer peripheral end of a semiconductor chip and an internal circuit is provided in a central region surrounded by the 10 region of the semiconductor chip has been known.

There are disclosed techniques listed below.
  [Patent Document 1] Japanese Unexamined Patent Application Publication No. 2020-161721
  [Patent Document 2] International Patent Publication No. 2016/203648

SUMMARY

When performing a test by applying an ESD surge to a semiconductor device, a level shifter circuit may be destroyed prior to an ESD protection circuit in some cases.

An object of this disclosure is to provide a technology capable of ensuring desired ESD resistance without destroying an internal circuit such as a level shifter circuit prior to an ESD protection circuit.

Other objects and novel features will be apparent from the description of this specification and accompanying drawings.

The outline of the representative embodiment in this disclosure will be briefly described as follows.

According to an embodiment of this disclosure, a semiconductor device includes an input/output cell, an IO power supply cell, a core power supply cell, and a core logic circuit arranged on a chip, and the core power supply cell includes an ESD protection circuit. The input/output cell includes a level shifter circuit and the level shifter circuit is arranged in the input/output cell. The core logic circuit is arranged outside the input/output cell. The core power supply cell is not arranged in the same row as the input/output cell, but is arranged in a third region provided between a first region in which the input/output cell and the IO power supply cell are arranged and a second region in which the core logic circuit is arranged.

With the semiconductor device according to the embodiment described above, it is possible to ensure desired ESD resistance without destroying an internal circuit such as a level shifter circuit prior to an ESD protection circuit.

DETAILED DESCRIPTION

Hereinafter, the embodiment and the example will be described with reference to drawings. However, in the following description, the same components are denoted by the same reference characters and the repetitive description thereof will be omitted in some cases. Note that the drawings may be shown schematically as compared with an actual aspect in order to make the description clearer, but they are mere examples and do not limit the interpretation of the present invention.

Embodiment

Figure 1:
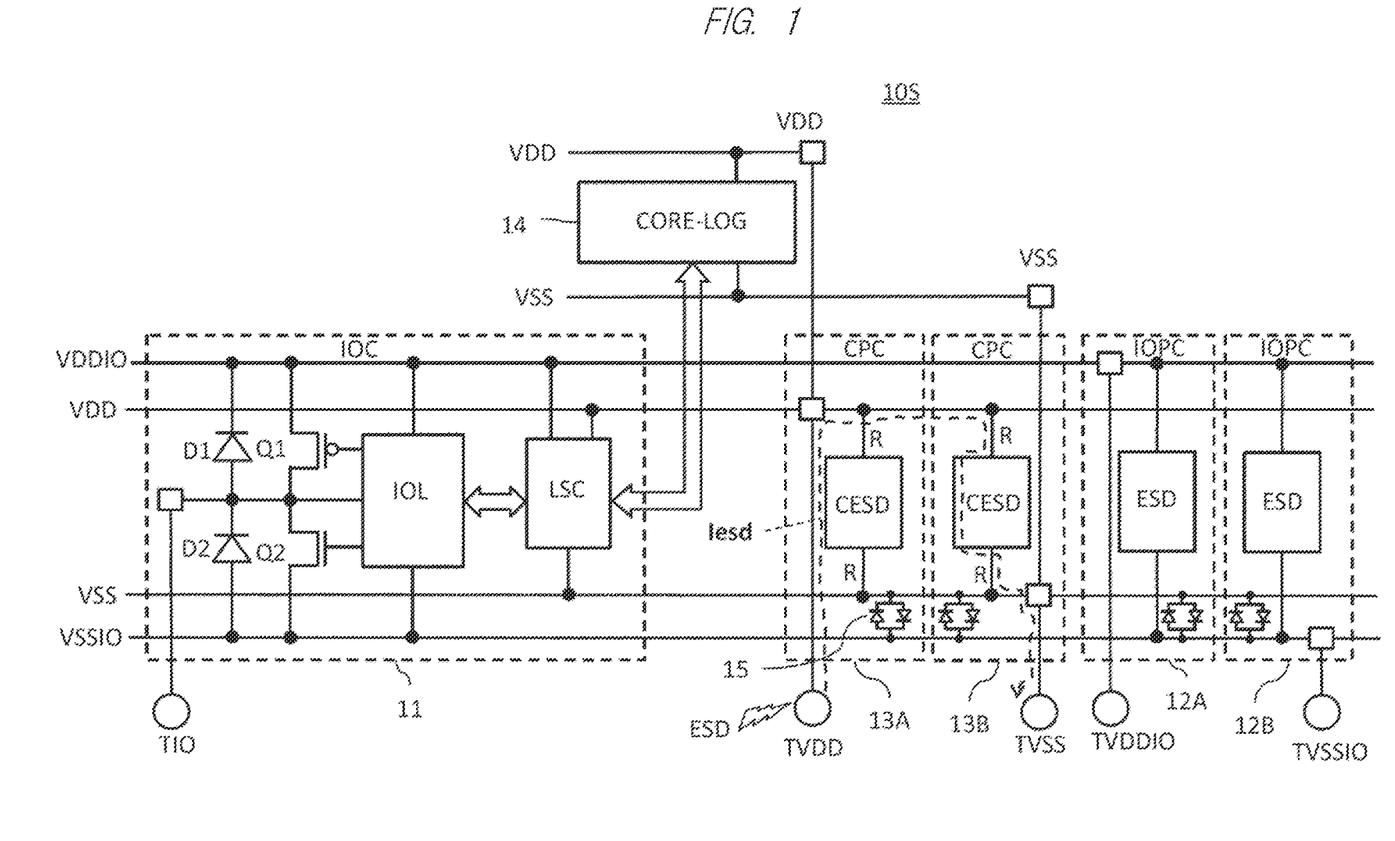
FIG. 1 is a schematic block diagram of a semiconductor device according to a comparative example.
Figure 2:
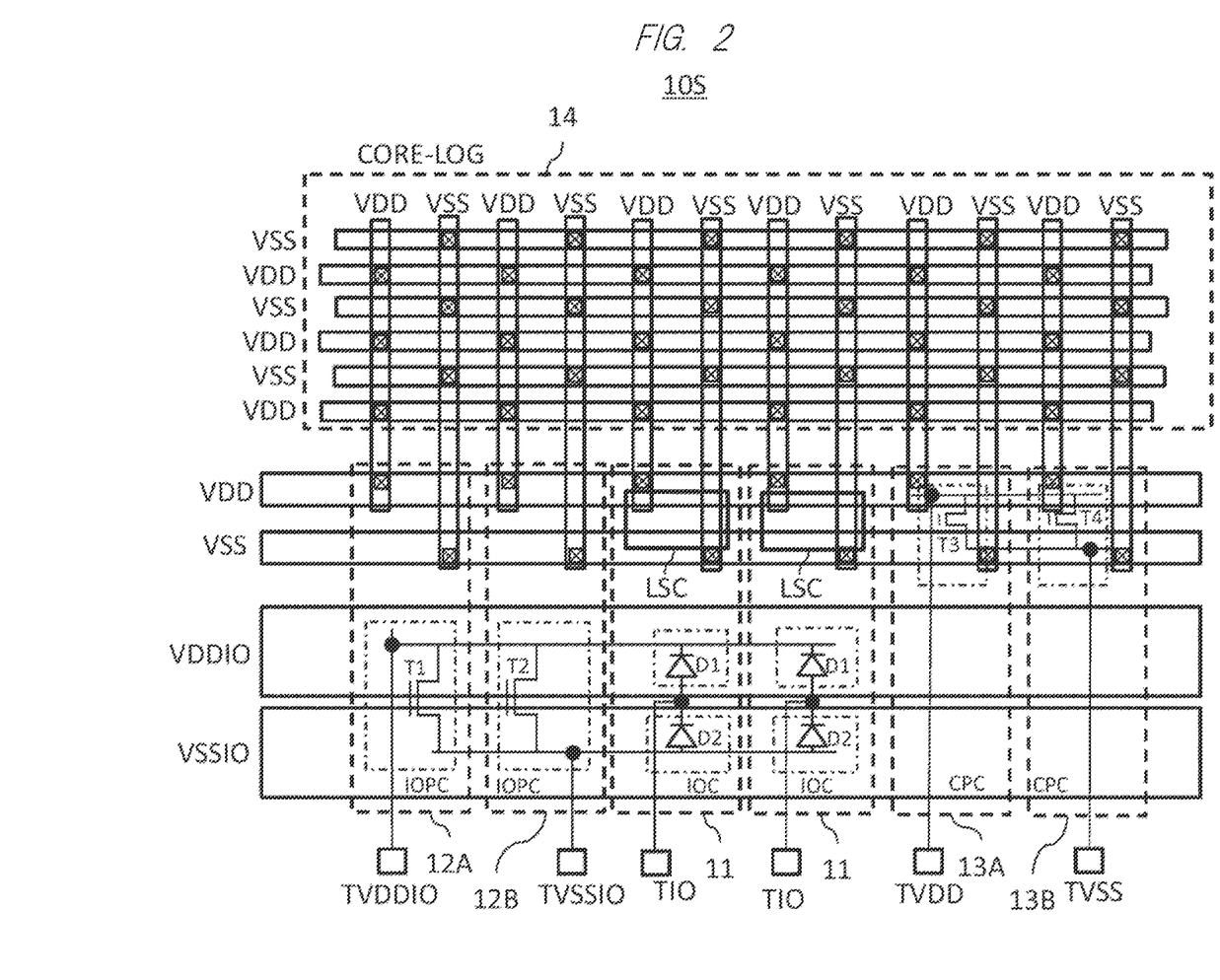
FIG. 2 is a schematic layout diagram of the semiconductor device shown in FIG. 1.

Prior to the description of the embodiment and the example according to this disclosure, the semiconductor device according to the technology studied by the present disclosers (hereinafter referred to as a comparative example) will be described with reference to FIG. 1 and FIG. 2 in order to make this disclosure easily understood. FIG. 1 is a schematic block diagram of a semiconductor device according to the comparative example. FIG. 2 is a schematic layout diagram of the semiconductor device shown in FIG. 1.

A semiconductor device 10S includes an input/output cell (IOC) 11, first power supply cells (10 power supply cells IOPC) 12 (IO power supply cell 12A, IO power supply cell 12B), and second power supply cells (core power supply cells CPC) 13 (core power supply cell 13A, core power supply cell 13B) in an outer peripheral portion of a rectangular semiconductor chip made of single crystal silicon or the like. The region where the input/output cell 11 and the power supply cells 12 and 13 are arranged is referred to as an IO region. The IO region is provided along the four sides of the chip end of the semiconductor chip in plan view. The semiconductor device 10S further includes an internal circuit 14 as a core logic circuit (CORE-LOG). The core logic region in which the internal circuit 14 is arranged is a central part of the semiconductor chip and is a region surrounded by the IO region.

The input/output cell 11 is a formation region of an input/output circuit connected to one input/output pad. Each of the power supply cells 12 and 13 is a formation region of an ESD protection circuit (CESD, ESD) that protects the semiconductor device from ESD (Electro-Static-Discharge) and noise and a wiring for supplying a power supply potential (VDDIO, VDD) or a ground potential (VSSIO, VSS) into the chip. Since it is necessary to evenly reduce the power supply impedance, the power supply cells 12 and 13 are arranged so as to be distributed for each of the plurality of input/output cells 11, and are arranged adjacently between the input/output cell 11 and the input/output cell 11.

The power supply potential (VDDIO, VDD) includes a first power supply potential VDDIO of the input/output cell 11 and a second power supply potential VDD of the internal circuit 14. Similarly, the ground potential (VSSIO, VSS) includes a first ground potential VSSIO of the input/output cell 11 and a second ground potential VSS of the internal circuit 14. The first power supply potential VDDIO can be presented as a potential larger than the second power supply potential VDD (VDDIO>VDD). The first power supply potential VDDIO, the first ground potential VSSIO, the second power supply potential VDD, and the second ground potential VSS are supplied to the input/output cell 11 via the power supply wiring. The second power supply potential VDD and the second ground potential VSS are supplied to the internal circuit 14 via the power supply wiring.

The IO power supply cell 12A includes the ESD protection circuit (ESD) and a bridge circuit 15, and supplies the first power supply potential VDDIO to the power supply wiring. The IO power supply cell 12B includes the ESD protection circuit (ESD) and a bridge circuit 15, and supplies the first ground potential VSSIO to the power supply wiring (referred to also as ground wiring).

The core power supply cell 13A includes the ESD protection circuit (CESD) and a bridge circuit 15, and supplies the second power supply potential VDD to the power supply wiring. The core power supply cell 13B includes the ESD protection circuit (CESD) and a bridge circuit 15, and supplies the second ground potential VSS to the power supply wiring (referred to also as ground wiring).

The ESD protection circuit (ESD) is connected between the power supply wiring to which the first power supply potential VDDIO is supplied and the power supply wiring to which the first ground potential VSSIO is supplied. The ESD protection circuit (CESD) is connected between the power supply wiring to which the second power supply potential VDD is supplied and the power supply wiring to which the second ground potential VSS is supplied.

The bridge circuit 15 is connected between the power supply wiring to which the first ground potential VSSIO is supplied and the power supply wiring to which the second ground potential VSS is supplied, and includes a pair of bidirectional diodes that connect the power supply wiring to which the first ground potential VSSIO is supplied and the power supply wiring to which the second ground potential VSS is supplied. An anode of one diode is connected to the power supply wiring to which the first ground potential VSSIO is supplied, and a cathode thereof is connected to the power supply wiring to which the second ground potential VSS is supplied. An anode of the other diode is connected to the power supply wiring to which the second ground potential VSS is supplied, and a cathode thereof is connected to the power supply wiring to which the first ground potential VSSIO is supplied.

The input/output cell 11 incorporates an input/output circuit connected to the input/output terminal (TIO). The input/output terminal TIO, the power supply terminals TVDD and TVDDIO, and the ground terminals TVSS and TVSSIO are arranged on the input/output cell 11, the IO power supply cell 12, and the core power supply cell 13, respectively, but these may be arranged separately from the input/output cell 11, the IO power supply cell 12, and the core power supply cell 13, respectively. The input/output terminal TIO, the power supply terminals TVDD and TVDDIO, and the ground terminals TVSS and TVSSIO are connected to a bonding wire or the like, and are referred to also as an input/output pad, a power supply pad, and a ground pad, respectively.

The input/output circuit constituting the input/output cell 11 includes diodes D1 and D2 constituting the ESD protection circuit, an output circuit having a P-channel transistor Q1 and an N-channel transistor Q2 that transmit an output signal to the signal wiring connected to the input/output terminal TIO, an input/output logic circuit IOL having a CMOS inverter that receives an input signal input from the input/output terminal TIO via a signal wiring, and a level shifter circuit LSC. The input signal input from the input/output terminal TIO via the signal wiring is input to the level shifter circuit LSC via the input/output logic circuit IOL, and is supplied to the internal circuit 14 after the level conversion by the level shifter circuit LSC. On the other hand, the signal output from the internal circuit 14 is input to the level shifter circuit LSC, is subjected to the level conversion, is supplied to the input/output logic circuit IOL, and is then output as an output signal from the output circuit having the P-channel transistor Q1 and the N-channel transistor Q2 to the input/output terminal TIO.

The P-channel transistor Q1 is connected between the power supply wiring of the first power supply potential VDDIO and the signal wiring from the input/output terminal TIO, and the N-channel transistor Q2 is connected between the signal wiring and the ground wiring of the first ground potential VSSIO. An anode of the diode D1 is connected to the signal wiring from the input/output terminal TIO, and a cathode thereof is connected to the power supply wiring of the first power supply potential VDDIO. An anode of the diode D2 is connected to the ground wiring of the first ground potential VSSIO, and a cathode thereof is connected to the signal wiring from the input/output terminal TIO. The diode D1 is configured to flow a surge current directed from the input/output terminal TIO to the power supply terminal VDDIO via the signal wiring and the power supply wiring of the first power supply potential VDDIO, and the diode D2 is configured to flow a surge current directed from the ground terminal TVDDIO to the input/output terminal TIO via the ground wiring of the first ground potential VSSIO and the signal wiring. The output circuit may be a so-called open drain type that does not have the P-channel transistor Q1. Further, it is not always necessary that the input/output circuit is provided with both the output circuit and the input circuit.

Each of the power supply cells 12A and 13A includes the ESD protection circuit (CESD, ESD) corresponding to the power supply terminal (TVDDIO, TVDD), and each of the power supply cells 12B and 13B includes the ESD protection circuit (CESD, ESD) corresponding to the ground terminal (TVSSIO, TVSS).

The first power supply potential VDDIO is, for example, 1.8 V (or 3.3 V), and the second power supply potential VDD is, for example, 0.8 V.

When the first power supply potential VDDIO is 1.8 V and the second power supply potential VDD is 0.8 V, (1) the transistors Q1 and Q2 of the output circuit and the input/output logic circuit IOL are composed of only MOSFETs with a withstand voltage of 1.8 V (referred to also as 1.8 V-MOS), (2) the internal circuit 14 is composed of only MOSFETs with a withstand voltage of 0.8 V (referred to also as core MOS), (3) the level shifter circuit LSC is composed of 1.8 V-MOS and core MOS provided in a mixed manner, (4) the core power supply cells 13A and 13B protect the core MOS of the internal circuit 14 and the core MOS of the level shifter circuit LSC, and (5) the IO power supply cells 12A and 12B protect the transistors Q1 and Q2 of the output circuit and the 1.8 V-MOS of the input/output logic circuit IOL.

FIG. 2 shows the arrangement relationship between the IO power supply cells 12A and 12B, the two input/output cells 11, and the core power supply cells 13A and 13B arranged in the IO region and the internal circuit 14 arranged in the core logic region. In FIG. 2, MOS transistors T1 and T2 indicate transistors constituting the ESD protection circuit (CESD), and MOS transistors T3 and T4 indicate transistors constituting the ESD protection circuit (ESD). As shown in FIG. 2, the IO power supply cells 12A and 12B, the two input/output cells 11, and the core power supply cells 13A and 13B are arranged in this order in the IO region, and the internal circuit 14 is arranged on the upper side of the IO region so as to be adjacent to the IO region.

For the ESD surge between the power supply terminal TVDD and the ground terminal TVSS in FIG. 1, the ESD current flows as shown by the ESD current Iesd. As a result, the level shifter circuit LSC, which is relatively smaller in scale than the core logic circuit serving as the internal circuit 14, is likely to be destroyed. This is because the wiring resistance of the portion indicated by R in the core power supply cell (13A, 13B) is deteriorated.

In the 7 nm generation, the level shifter circuit LCS is destroyed prior to the ESD protection circuit (CESD) in the cell arrangement method shown in FIG. 2 due to the influence of the deterioration of resistance of the core MOS and the deterioration of the wiring resistance in the core power supply cell (13A, 13B). Therefore, there is a problem that the ESD resistance level (human body model (HBM): 2 kV) required for in-vehicle products cannot be achieved.

A semiconductor device 10 of this disclosure is a semiconductor device in which an input/output cell 11, TO power supply cells 12 (12A, 12B), core power supply cells 13 (13A, 13B), and a core logic circuit 14 are arranged on a semiconductor chip (101). The core power supply cell 13 (13A, 13B) includes an ESD protection circuit (CESD).

The input/output cell 11 includes a level shifter circuit LSC, and the level shifter circuit LSC is arranged in the input/output cell 11.

The core logic circuit 14 is arranged outside the input/output cell 11.

The core power supply cell 13 (13A, 13B) is not arranged in the same row as the input/output cell 11, but is arranged in a third region (13R) between a first region (TO region TOR) of the input/output cell 11 and the TO power supply cells 12 (12A, 12B) and a second region (central region CER) of the core logic circuit 14.

Further, the core power supply cell 13 (13A, 13B) is formed such that a long side B2 of external dimensions thereof is shorter than a long side B1 of an outer shape of the TO power supply cell 12 (12A, 12B) (B2<B1), and a short side A2 of external dimensions thereof is equal to or greater than a short side A1 of an outer shape of the TO power supply cell 12 (12A, 12B) (A2≥A1).

Further, the core power supply cell 13 (13A, 13B) is not arranged between the input/output cell 11 and the core logic circuit 14, but is arranged in a fourth region (13RR) between the TO power supply cell 12 (12A, 12B) and the core logic circuit 14.

Consequently, according to the semiconductor device mentioned above, the desired ESD resistance can be ensured without destroying the internal circuit such as the level shifter circuit LSC prior to the ESD protection circuit (CESD).

In the advanced CMOS technology of the 7 nm generation, the desired ESD resistance can be ensured without destroying the internal circuit (for example, level shifter circuit LSC), which is vulnerable to electrostatic stress, prior to the protection circuit. In particular, it is possible to reliably achieve the HBM of 2 kV required for in-vehicle semiconductor products.

Example

Figure 3:
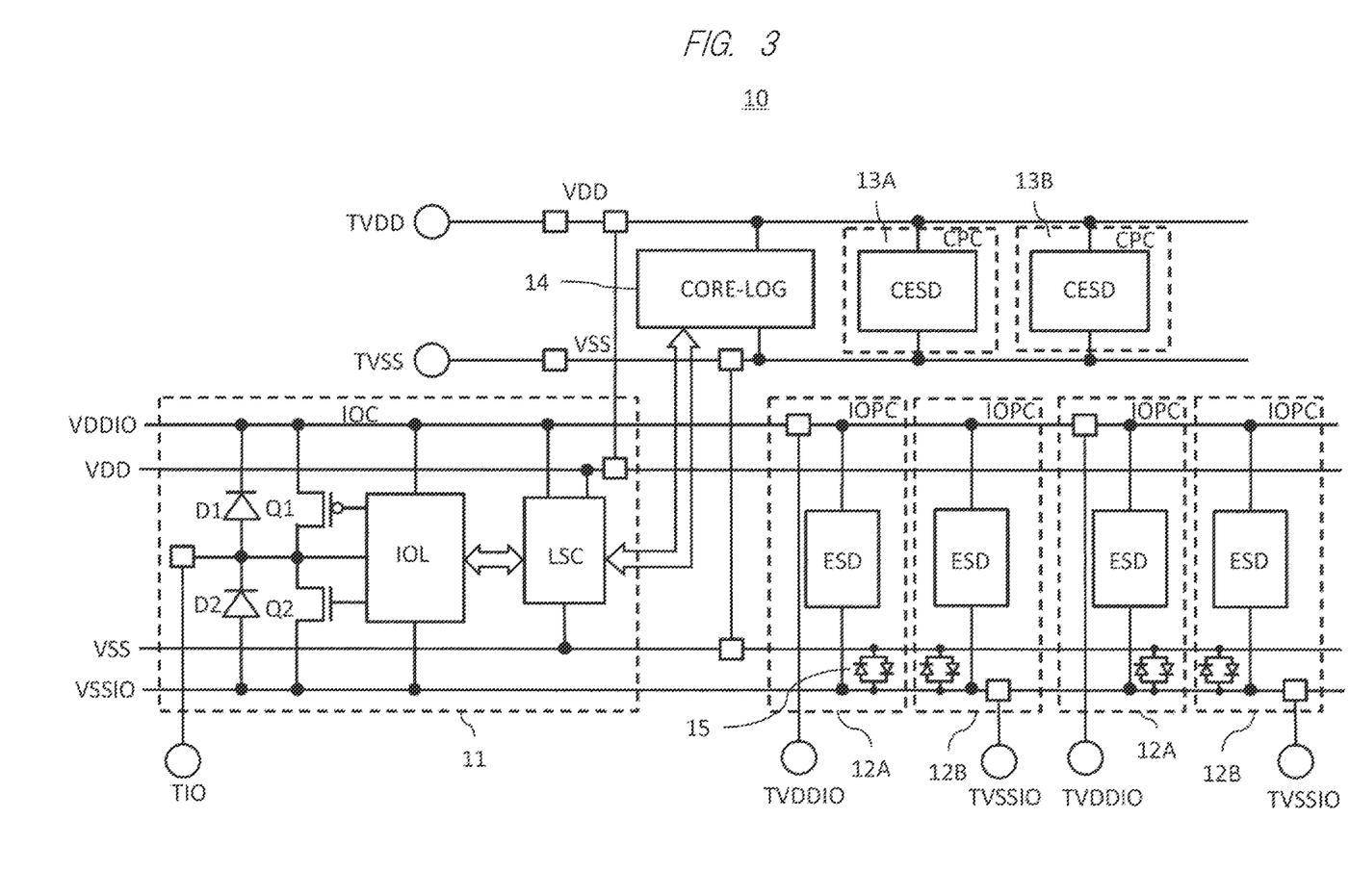
FIG. 3 is a schematic block diagram of a semiconductor device according to an example.
Figure 4:
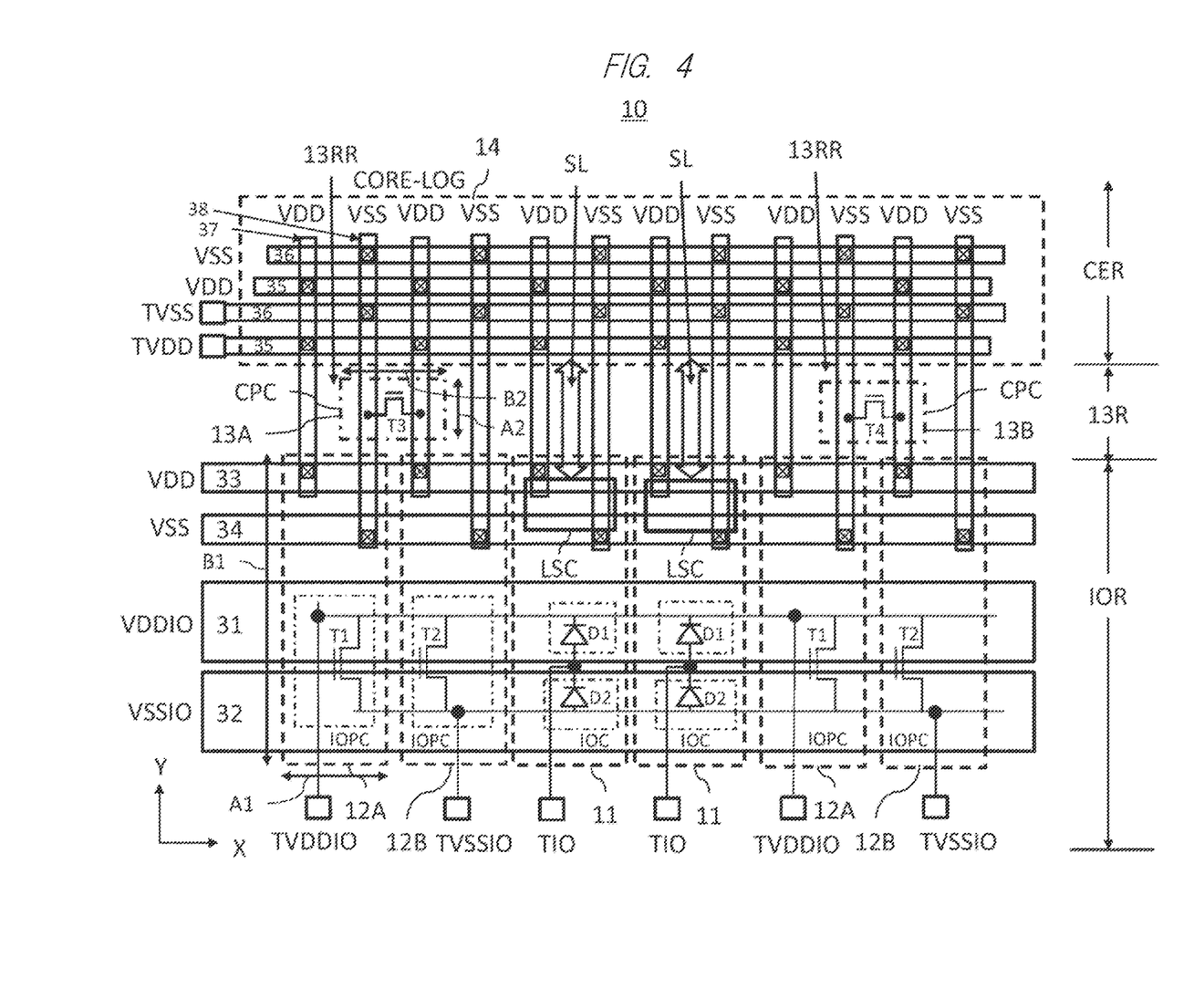
FIG. 4 is a schematic layout diagram of the semiconductor device shown in FIG. 3.
Figure 5:
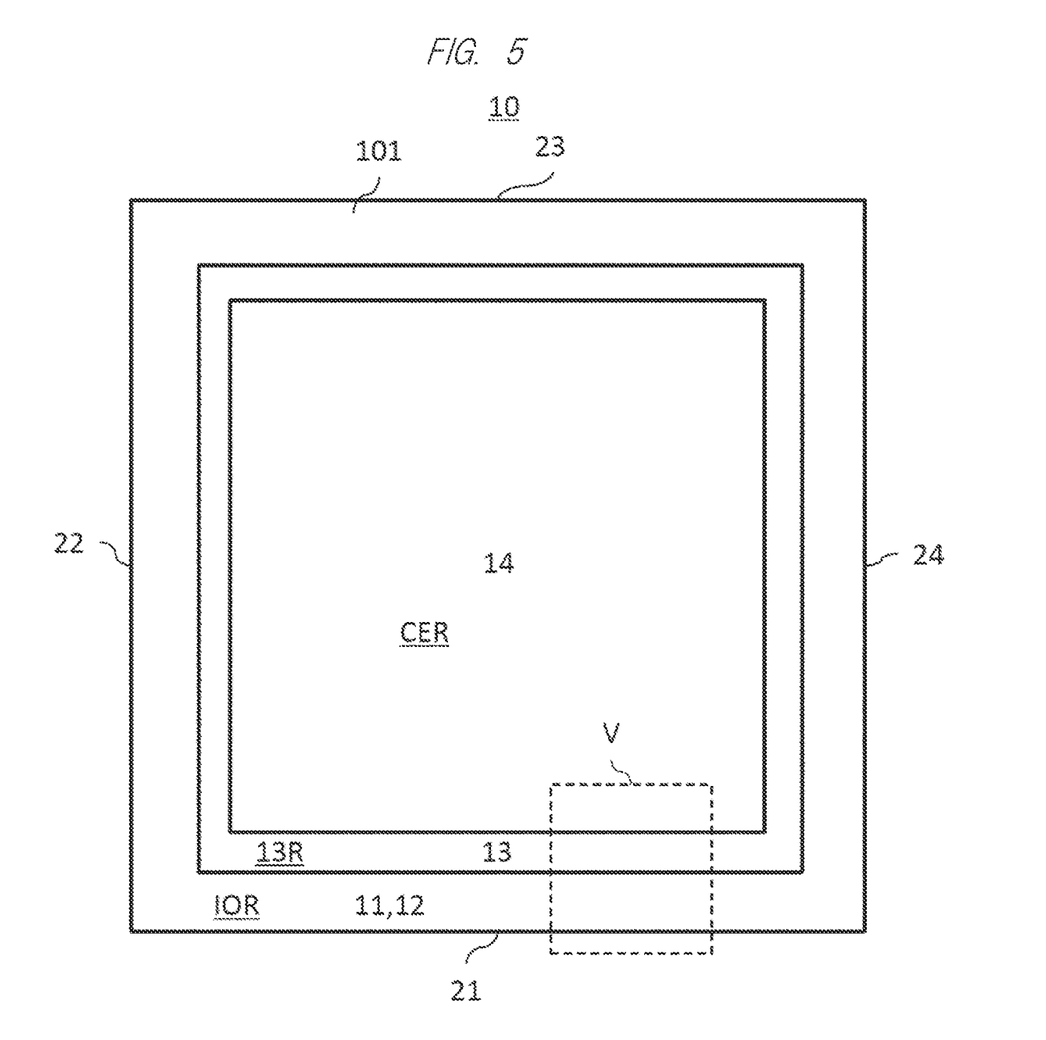
FIG. 5 is a schematic plan view of a semiconductor chip in which the semiconductor device in FIG. 3 is formed.

Next, the semiconductor device 10 according to an example will be described with reference to FIG. 3 to FIG. 5. FIG. 3 is a schematic block diagram of the semiconductor device according to an example. FIG. 4 is a schematic layout diagram of the semiconductor device shown in FIG. 3. FIG. 5 is a schematic plan view of a semiconductor chip in which the semiconductor device in FIG. 3 is formed. FIG. 4 shows the layout arrangement in the dotted-line region denoted by V in FIG. 5.

As shown in FIG. 5, the semiconductor device 10 includes an input/output cell (IOC) 11, first power supply cells (IO power supply cells IOPC) 12 (10 power supply cell 12A, IO power supply cell 12B), and second power supply cells (core power supply cells CPC) 13 (core power supply cell 13A, core power supply cell 13B) in an outer peripheral portion of a rectangular semiconductor chip 101 made of single crystal silicon or the like. The region where the input/output cell 11 and the power supply cells 12 are arranged is referred to as an IO region IOR. The IO region IOR is provided along four sides 21, 22, 23, and 24 of the chip end of the semiconductor chip 101 in plan view. The four sides 21, 22, 23, and 24 include the first side 21, the third side 23 provided to face the first side 21, the second side 22 provided between the first side 21 and the third side 23, and the fourth side 24 provided to face the second side 22.

The semiconductor device 10 further includes an internal circuit 14 as a core logic circuit (CORE-LOG). The core logic region (referred to also as a central region or a second region) CER in which the internal circuit 14 is arranged is provided in the central portion of the semiconductor chip 101. The second power supply cells (core power supply cells CPC) 13 (core power supply cell 13A, core power supply cell 13B) are arranged in the region (referred to also as the third region) 13R between the core logic region CER and the IO region IOR.

FIG. 3 shows a schematic block diagram of the semiconductor device 10 according to the example. The semiconductor device 10 in FIG. 3 differs from the semiconductor device 10S in FIG. 1 in that the core power supply cell 13A and the core power supply cell 13B are not provided in the array of the input/output cell (IOC) 11 and the first power supply cells (IO power supply cells IOPC), but are provided on the side with the internal circuit 14. Further, the core power supply cell 13A and the core power supply cell 13B are not provided with the bridge circuit 15 in this example.

Since the other configurations and operations in FIG. 3 are the same as those in FIG. 1, duplicate description will be omitted. Namely, the description of FIG. 1 can be used and referenced for the description of the circuit configuration, operation, and connection of the input/output cell 11, the IO power supply cell 12A, the IO power supply cell 12B, the core power supply cell 13A, and the core power supply cell 13B.

As shown in FIG. 3 and FIG. 4, the semiconductor device 10 includes an input/output terminal TIO, a first power supply terminal TVDDIO, a second power supply terminal TVDD, a first ground terminal TVSSIO, and a second ground terminal TVSS. A first power supply potential VDDIO is supplied to the first power supply terminal TVDDIO. A second power supply potential VDD is supplied to the second power supply terminal TVDD. A first ground potential VSSIO is supplied to the first ground terminal TVSSIO. A second ground potential VSS is supplied to the second ground terminal TVSS.

In the IO region IOR, a first power supply wiring 31, a second power supply wiring (referred to also as a first ground wiring) 32, a third power supply wiring 33, and a fourth power supply wiring (referred to also as a second ground wiring) 34 are provided along the first direction X. The first power supply potential VDDIO is supplied to the first power supply wiring 31 from the first power supply terminal TVDDIO. The first ground potential VSSIO is supplied to the second power supply wiring (first ground wiring) 32 from the first ground terminal TVSSIO. The second power supply potential VDD is supplied to the third power supply wiring 33 from the second power supply terminal TVDD. The second ground potential VSS is supplied to the fourth power supply wiring (second ground wiring) 34 from the second ground terminal TVSS.

In the core logic region CER, a fifth power supply wiring 35 and a sixth power supply wiring 36 provided along the first direction X and a seventh power supply wiring 37 and an eighth power supply wiring 38 provided along the second direction Y intersecting the first direction X are provided. The fifth power supply wiring 35 is connected to the second power supply terminal TVDD, and the sixth power supply wiring 36 is connected to the second ground terminal TVSS. The fifth power supply wiring 35 and the seventh power supply wiring 37 are electrically connected, and the second power supply potential VDD is supplied from the second power supply terminal TVDD. The sixth power supply wiring 36 and the eighth power supply wiring 38 are electrically connected, and the second ground potential VSS is supplied from the second ground terminal TVSS.

Each of the seventh power supply wiring 37 and the eighth power supply wiring 38 is arranged also in the region 13R and is connected to the third power supply wiring 33 and the fourth power supply wiring 34 provided in the IO region IOR. The core power supply cell 13A and the core power supply cell 13B are connected between the seventh power supply wiring 37 and the eighth power supply wiring 38 arranged in the region 13R.

The first power supply potential VDDIO, the first ground potential VSSIO, the second power supply potential VDD, and the second ground potential VSS are supplied to the input/output cell 11. The second power supply potential VDD and the second ground potential VSS are supplied to the internal circuit 14.

The IO power supply cell 12A includes an ESD protection circuit (ESD) having a transistor T1 and a bridge circuit 15, and supplies the first power supply potential VDDIO to the power supply wiring 31. The IO power supply cell 12B includes an ESD protection circuit (ESD) having a transistor T2 and a bridge circuit 15, and supplies the first ground potential VSSIO to the power supply wiring 32.

The ESD protection circuit (ESD) is connected between the power supply wiring 31 to which the first power supply potential VDDIO is supplied and the power supply wiring 32 to which the first ground potential VSSIO is supplied.

The bridge circuit 15 is connected between the power supply wiring 32 to which the first ground potential VSSIO is supplied and the power supply wiring 34 to which the second ground potential VSS is supplied, and includes a pair of bidirectional diodes that connect the power supply wiring 32 to which the first ground potential VSSIO is supplied and the power supply wiring 34 to which the second ground potential VSS is supplied. An anode of one diode is connected to the power supply wiring 32 to which the first ground potential VSSIO is supplied, and a cathode thereof is connected to the power supply wiring 34 to which the second ground potential VSS is supplied. An anode of the other diode is connected to the power supply wiring 34 to which the second ground potential VSS is supplied, and a cathode thereof is connected to the power supply wiring 32 to which the first ground potential VSSIO is supplied.

The core power supply cell 13A includes the ESD protection circuit (CESD) having a transistor T3, and the core power supply cell 13B includes the ESD protection circuit (CESD) having a transistor T4. The core power supply cell 13A and the core power supply cell 13B protect the internal circuit 14 from the ESD and noise. The source-drain path of the transistors T3 and T4 is connected between the seventh power supply wiring 37 and the eighth power supply wiring 38 arranged in the region 13R.

The input/output cell 11 incorporates an input/output circuit connected to the input/output terminal (TIO). The input/output terminal TIO, the power supply terminals TVDD and TVDDIO, and the ground terminals TVSS and TVSSIO are arranged on the input/output cell 11, the IO power supply cell 12, and the core power supply cell 13, respectively, but these may be arranged separately from the input/output cell 11, the IO power supply cell 12, and the core power supply cell 13, respectively. The input/output terminal TIO, the power supply terminals TVDD and TVDDIO, and the ground terminals TVSS and TVSSIO are connected to a bonding wire or the like, and are referred to also as an input/output pad, a power supply pad, and a ground pad, respectively.

The input/output circuit constituting the input/output cell 11 includes diodes D1 and D2 constituting the ESD protection circuit, an output circuit having a P-channel transistor Q1 and an N-channel transistor Q2 that transmit an output signal to the signal wiring connected to the input/output terminal TIO, an input/output logic circuit IOL having a CMOS inverter that receives an input signal input from the input/output terminal TIO via a signal wiring, and a level shifter circuit LSC. The input signal input from the input/output terminal TIO via the signal wiring is input to the level shifter circuit LSC via the input/output logic circuit IOL, and is supplied to the internal circuit 14 after the level conversion by the level shifter circuit LSC. On the other hand, the signal output from the internal circuit 14 is input to the level shifter circuit LSC, is subjected to the level conversion, is supplied to the input/output logic circuit IOL, and is then output as an output signal from the output circuit having the P-channel transistor Q1 and the N-channel transistor Q2 to the input/output terminal TIO.

The P-channel transistor Q1 is connected between the power supply wiring 31 of the first power supply potential VDDIO and the signal wiring from the input/output terminal TIO, and the N-channel transistor Q2 is connected between the signal wiring and the ground wiring 32 of the first ground potential VSSIO. An anode of the diode D1 is connected to the signal wiring from the input/output terminal TIO, and a cathode thereof is connected to the power supply wiring 31 of the first power supply potential VDDIO. An anode of the diode D2 is connected to the ground wiring 32 of the first ground potential VSSIO, and a cathode thereof is connected to the signal wiring from the input/output terminal TIO. The diode D1 is configured to flow a surge current directed from the input/output terminal TIO to the power supply terminal VDDIO via the signal wiring and the power supply wiring 31 of the first power supply potential VDDIO, and the diode D2 is configured to flow a surge current directed from the ground terminal TVDDIO to the input/output terminal TIO via the ground wiring 32 of the first ground potential VSSIO and the signal wiring. The output circuit may be a so-called open drain type that does not have the P-channel transistor Q1. Further, it is not always necessary that the input/output circuit is provided with both the output circuit and the input circuit.

In FIG. 3, the internal circuit 14, the core power supply cell 13A, and the core power supply cell 13B are connected between the power supply wiring (35, 37, see FIG. 4) to which the second power supply potential VDD is supplied from the power supply terminal TVDD and the ground wiring (36, 38, see FIG. 4) to which the second ground potential VSS is supplied from the ground terminal TVSS. As shown in FIG. 3, since the core power supply cell 13A and the core power supply cell 13B are not arranged in the same row as the input/output cell 11, it is possible to prevent the increase in the wiring resistance in the cell.

As shown in FIG. 4, the input/output cell 11, the 10 power supply cell 12A, and the power supply cell 12B are arranged in the 10 region IOR. In this example, the 10 power supply cell 12A and the 10 power supply cell 12B are arranged on both sides of the input/output cell 11. The internal circuit 14 is arranged in the core logic region CER. Also, the core power supply cell 13A and the core power supply cell 13B are arranged in the region 13R between the core logic region CER and the 10 region IOR. Further, the core power supply cell 13A and the core power supply cell 13B are arranged in the region (referred to also as the fourth region) 13RR between the core logic region CER and the 10 power supply cells 12A and 12B.

The power supply terminal TVDD is connected to the power supply wiring 35 of the second power supply potential VDD arranged in the internal circuit 14. Further, the ground terminal TVSS is configured to be connected to the ground wiring 36 of the second ground potential VSS arranged in the internal circuit 14.

Here, the features of the configuration example of the layout diagram of FIG. 4 will be described.

Here, the long side B2 of the outer shape of the core power supply cell 13 (13A, 13B) can be presented as a side of the core power supply cell 13 (13A, 13B) along the direction of the source-drain path (or the gate length direction) of the transistors T3 and T4 of the core power supply cell 13 (13A, 13B). The short side A2 of the outer shape of the core power supply cell 13 (13A, 13B) can be presented as a side of the core power supply cell 13 (13A, 13B) along the direction orthogonal to the direction of the source-drain path (or the gate width direction) of the transistors T3 and T4 of the core power supply cell 13 (13A, 13B).

Further, the long side B1 of the outer shape of the IO power supply cell 12 (12A, 12B) can be presented as a side of the IO power supply cell 12 (12A, 12B) along the direction of the source-drain path (or the gate length direction) of the transistors T1 and T2 of the IO power supply cell 12 (12A, 12B). The short side A1 of the outer shape of the IO power supply cell 12 (12A, 12B) can be presented as a side of the IO power supply cell 12 (12A, 12B) along the direction orthogonal to the direction of the source-drain path (or the gate width direction) of the transistors T1 and T2 of the IO power supply cell 12 (12A, 12B).

(1) In order to prevent the increase in the wiring resistance in the core power supply cell 13 (13A, 13B), the core power supply cell 13 (13A, 13B) is not arranged in the same row as the input/output cell 11, but is arranged in the region (fourth region) 13RR between the formation region of the IO power supply cell 12 (12A, 12B) and the formation region of the internal circuit 14.

(2) The long side B2 of the outer shape of the core power supply cell 13 (13A, 13B) is smaller than the long side B1 of the IO power supply cell 12 (12A, 12B) (B2<B1).

(3) The short side A2 of the outer shape of the core power supply cell 13 (13A, 13B) is equal to or greater than the short side A1 of the IO power supply cell 12 (12A, 12B) (A2≥A1).

(4) The core power supply cell 13 (13A, 13B) is not arranged between the input/output cell 11 and the internal circuit 14. As a result, the degree of freedom in layout of the signal wiring SL between the level shifter circuit LSC and the internal circuit 14 can be improved.

With the semiconductor device according to the example, the desired ESD resistance can be ensured without destroying the internal circuit (for example, level shifter circuit LSC), which is vulnerable to electrostatic stress, prior to the ESD protection circuit (CESD). In particular, it is possible to reliably achieve the HBM of 2 kV required for in-vehicle semiconductor products.

In the foregoing, the disclosure made by the present disclosers has been specifically described based on the embodiment and the example, but it goes without saying that this disclosure is not limited to the embodiment and example described above and can be modified in various ways.

What is claimed is:

1. A semiconductor device in which an input/output cell, an IO power supply cell, a core power supply cell, and a core logic circuit are arranged on a chip,
    wherein the core power supply cell includes an ESD protection circuit,
    wherein the input/output cell includes a level shifter circuit and the level shifter circuit is arranged in the input/output cell,
    wherein the core logic circuit is arranged outside the input/output cell,
    wherein the core power supply cell is not arranged in the same row as the input/output cell, but is arranged in a third region provided between a first region in which the input/output cell and the IO power supply cell are arranged and a second region in which the core logic circuit is arranged, and
    wherein the core power supply cell is formed such that a long side of external dimensions thereof is shorter than a long side of an outer shape of the IO power supply cell, and a short side of external dimensions thereof is equal to or greater than a short side of the outer shape of the IO power supply cell.

2. The semiconductor device according to claim 1,
    wherein the core power supply cell is not arranged between the input/output cell and the core logic circuit, but is arranged in a fourth region between the IO power supply cell and the core logic circuit.

* * * * *